(12) United States Patent
Kim et al.

(10) Patent No.: US 6,979,628 B2
(45) Date of Patent: Dec. 27, 2005

(54) METHODS OF FORMING SEMICONDUCTOR DEVICES HAVING FIELD OXIDES IN TRENCHES AND DEVICES FORMED THEREBY

(75) Inventors: Hong-Soo Kim, Kyungki-do (KR); Kyu-Charn Park, Kyungki-do (KR); Jung-Dal Choi, Kyungki-do (KR); Seong-Soon Cho, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 48 days.

(21) Appl. No.: 10/726,788

(22) Filed: Dec. 2, 2003

(65) Prior Publication Data

US 2004/0137696 A1   Jul. 15, 2004

(30) Foreign Application Priority Data

Jan. 10, 2003   (KR) ................... 10-2003-0001575

(51) Int. Cl.⁷ ............................................. H01L 21/76
(52) U.S. Cl. ................. 438/427; 438/424; 438/433
(58) Field of Search .......................... 438/424, 427, 438/433

(56) References Cited

U.S. PATENT DOCUMENTS

| | | | | |
|---|---|---|---|---|
| 4,551,911 A | * | 11/1985 | Sasaki et al. | 438/359 |
| 4,853,344 A | * | 8/1989 | Darmawan | 438/426 |
| 5,252,510 A | * | 10/1993 | Lee et al. | 438/401 |
| 5,536,675 A | * | 7/1996 | Bohr | 438/427 |
| 6,144,086 A | * | 11/2000 | Brown et al. | 257/510 |
| 6,586,295 B2 | * | 7/2003 | Ohno | 438/221 |
| 6,667,226 B2 | * | 12/2003 | Pinto et al. | 438/524 |

FOREIGN PATENT DOCUMENTS

| JP | 10-056059 | 2/1998 |
|---|---|---|
| KR | 2001-0054164 | 7/2001 |

OTHER PUBLICATIONS

English language abstract of Japanese Publication No. 10-056059.
English language abstract of Korean Publication No. 1020010054164 A.

* cited by examiner

Primary Examiner—Christian Wilson
(74) Attorney, Agent, or Firm—Marger Johnson & McCollom, P.C.

(57) ABSTRACT

Semiconductor devices and methods of forming devices that have field oxides in trenches are disclosed. According to the methods, a semiconductor substrate is prepared. An upper trench is formed at a predetermined region of the semiconductor substrate and a bottom trench is formed at a bottom surface of the upper trench. A field oxide is formed to fill the bottom trench and the upper trench. At this time, the upper trench has a wider width than the bottom trench.

22 Claims, 13 Drawing Sheets

METHODS OF FORMING SEMICONDUCTOR DEVICES HAVING FIELD OXIDES IN TRENCHES AND DEVICES FORMED THEREBY

This application claims priority from Korean Patent Application No. 2003-01575, filed on Jan. 10, 2003, the contents of which are incorporated herein by reference in their entirety.

BACKGROUND OF THE INVENTION

1. Field of the Invention

The present invention relates generally to semiconductor devices and methods of forming semiconductor devices, and more particularly to methods of forming semiconductor devices having field oxides in trenches.

2. Description of the Related Art

Field oxides in a semiconductor device are used to isolate devices from neighboring devices. As semiconductor devices become highly integrated, field oxides occupying small areas and having superior insulation characteristics are required.

Field oxides can be formed by using a shallow trench isolation (STI) method or by using a local oxidation of silicon (LOCOS) method. According to the STI method, a semiconductor substrate is etched to form a trench having a predetermined depth, and the trench is filled with insulation layers. The STI method can form field oxides occupying small areas and having a superior insulation characteristics in comparison with a local oxidation of silicon (LOCOS) method of forming a thermal oxide at a semiconductor substrate.

Semiconductor devices may be classified into volatile memory devices and a nonvolatile memory devices. A volatile memory device is a memory device which will lose data stored in a memory cell when the power supply is cut down. A non-volatile memory device is a device which will retain data stored in a memory cell even though the power supply is cut down. Volatile memory device include dynamic random access memory (DRAM) devices and a static random access memory (SRAM) devices. A flash memory device is a nonvolatile memory device.

Generally, when data is stored in a memory cell of a flash memory device or erased there from, a higher operation voltage is needed. Thus, in general flash memory devices have a high-voltage region where devices are formed so as to control high voltages.

FIGS. 1 and 2 illustrate by cross-sectional views a conventional method of forming a flash memory device having field oxides. In the FIGS. 1 and 2, reference letters "a" and "b" indicate a cell region and a high-voltage region, respectively.

Referring to FIGS. 1 and 2, a semiconductor substrate 1 having the cell region "a" and the high-voltage region "b" is prepared. A channel stop impurity-doped region 2 is formed into the semiconductor substrate 1 of the high-voltage region "b" with a predetermined depth. A hard mask layer 3 is formed on a surface of the semiconductor substrate 1 having the channel stop impurity-doped region 2. The hard mask layer 3 is patterned to form a cell trench 4a to define an active region at the cell region "a" and to simultaneously form a high-voltage trench 4b exposing the channel stop impurity-doped region 2 at the high-voltage region "b". A higher voltage than a power voltage is supplied on the high-voltage region "b". As the high-voltage trench 4b has a deeper depth and a wider width. The cell trench 4a and the high-voltage trench 4b are simultaneously formed. Thus, the cell trench 4a and the high-voltage trench 4b have the same depth. Furthermore, the cell trench 4a has a narrower width than the high-voltage trench 4b. As a result, an aspect ratio of the cell trench 4a is higher than the high-voltage trench 4b.

A field oxide layer 5 is formed on a surface of a semiconductor substrate 1 to fill the cell trench 4a and the high-voltage trench 4b.

The field oxide layer 5 is planarized to expose the hard mask layer 3 and to form a cell field oxide 5a filling the cell trench 4a and a high-voltage field oxide 5b filling the high-voltage trench 4b. A high-voltage gate pattern (not illustrated) is formed at the high-voltage region "b", and an impurity-doped region 7 is formed into an active region at both sides of the high-voltage gate pattern. The impurity-doped region 7 corresponds to source/drain regions of a high-voltage transistor.

In the described conventional method, voids 6 may be formed in the cell field oxides 5a due to the high aspect ratio of the cell trenches 4a. The voids 6 may deteriorate reliability of a semiconductor device.

The voids 6 may be prevented by reducing the depth of the cell trench 4a. In this case, however, the depth of the high-voltage trench 4b is also reduced. As a result, a punch through may occur between the source/drain regions 7 for the high-voltage transistor at the both side walls of the high-voltage filed oxide 5b. Additionally, as the channel stop impurity-doped region 2 is close to the surface of the active region at the high-voltage region b, a channel region (not illustrated) under the high-voltage transistor has a high-doping concentration to increase a threshold voltage of the high-voltage transistor. This can result in reliability problems of the high-voltage transistor.

SUMMARY OF THE INVENTION

According to an embodiment of the present invention, a semiconductor substrate is prepared. An upper trench at a predetermined region of the semiconductor substrate and a bottom trench at a bottom surface of the upper trench are formed. A field oxide is formed to fill the bottom trench and the upper trench. At this time, the upper trench has a wider width than the bottom trench.

The upper trench and the bottom trench may be formed by the following sequences. First, an assistant trench is formed at a predetermined region of the semiconductor substrate. A trench mask layer is formed on the semiconductor substrate having the assistant trench. An opening is formed to expose the assistant trench and a predetermined region of the semiconductor substrate at both sides of the assistant trench by patterning the trench mask layer. Then, the upper trench and the bottom trench are formed by anisotropically etching the exposed bottom surface of the assistant trench and the semiconductor substrate. At this time, the upper trench has substantially the same width as the opening and the bottom trench has substantially the same width as the assistant trench. Alternatively, the upper trench and the bottom trench may be formed by the following sequences. That is, an upper trench is formed at a predetermined region of the semiconductor substrate. Then, the bottom trench is formed by selectively etching a bottom predetermined region of the upper trench.

According to another aspect of the present invention, a semiconductor substrate having a first region and a second region is prepared. A first trench is formed at a predetermined region of the semiconductor substrate at the first region and a second trench composed of an upper trench at a predetermined region of the semiconductor substrate at the second region and a bottom trench at the bottom of the upper trench is formed. A first field oxide is formed to fill the first trench and a second field oxide is formed to fill the second trench. At this time, the first trench and the upper trench have identical depths from a surface of the semiconductor substrate and the upper trench has a wider with than the bottom trench.

According to another aspect of the present invention, the first trench and the second trench may be formed by the following sequences. First, an assistant trench is formed at a predetermined region of the semiconductor substrate at the second region. A trench mask layer is formed on the semiconductor substrate having the assistant trench. The trench mask layer is patterned to form a first opening exposing a predetermined region of the semiconductor substrate at the first region and a second opening exposing the assistant trench and a predetermined region of the semiconductor substrate at both sides of the assistant trench at the second region. Then, the semiconductor substrate and a bottom surface of the assistant trench exposed by the first opening and the second opening are anisotropically etched to form the first trench and the second trench. At this time, the upper trench has substantially the same width with the second opening and the bottom trench has substantially the same width as the assistant trench. Alternatively, the first trench and the second trench may be formed by the following sequences. That is, a first trench is formed at a predetermined region of the semiconductor substrate at the first region and an upper trench is formed at a predetermined region of the semiconductor substrate at the second region. And then, a bottom trench is formed by selectively etching a predetermined region of a bottom surface of the upper trench.

According to still another aspect of the present invention, a semiconductor substrate having a first region, a second region and a key region is prepared. An assistant trench is formed at a predetermined region of a semiconductor substrate at the second region and an initial key trench is formed at a predetermined region of the semiconductor substrate at the key region. A trench mask layer is formed on a surface of the semiconductor substrate having the assistant trench and the key trench. The trench mask layer is patterned to form a first opening exposing a predetermined region of the semiconductor substrate at the first region, a second opening exposing the assistant trench and a predetermined region of the semiconductor substrate at both sides of the assistant trench at the second region and a key opening exposing the initial key trench and a predetermined region of the semiconductor substrate at the key region. The bottom surface of the assistant trench and the exposed semiconductor substrate are anisotropically etched to from a first trench at the first region, a second trench composed of an upper trench at a surface of the semiconductor substrate at the second region and a bottom trench at a bottom surface of the upper trench, and a key trench composed of an upper key trench at a surface of the semiconductor substrate at the key region and a bottom key trench at a bottom surface of the upper key trench. Then, a first field oxide is formed in the first trench, a second field oxide is formed in the second trench and a key field oxide is formed in the key trench. At this time, the first trench, the upper trench and the upper key trench have like depths from a surface of the semiconductor substrate and the upper trench has substantially the same width as the second opening. Also, the bottom trench has substantially the same width as the assistant trench.

DESCRIPTION OF THE PREFERRED EMBODIMENT

Figure 1:
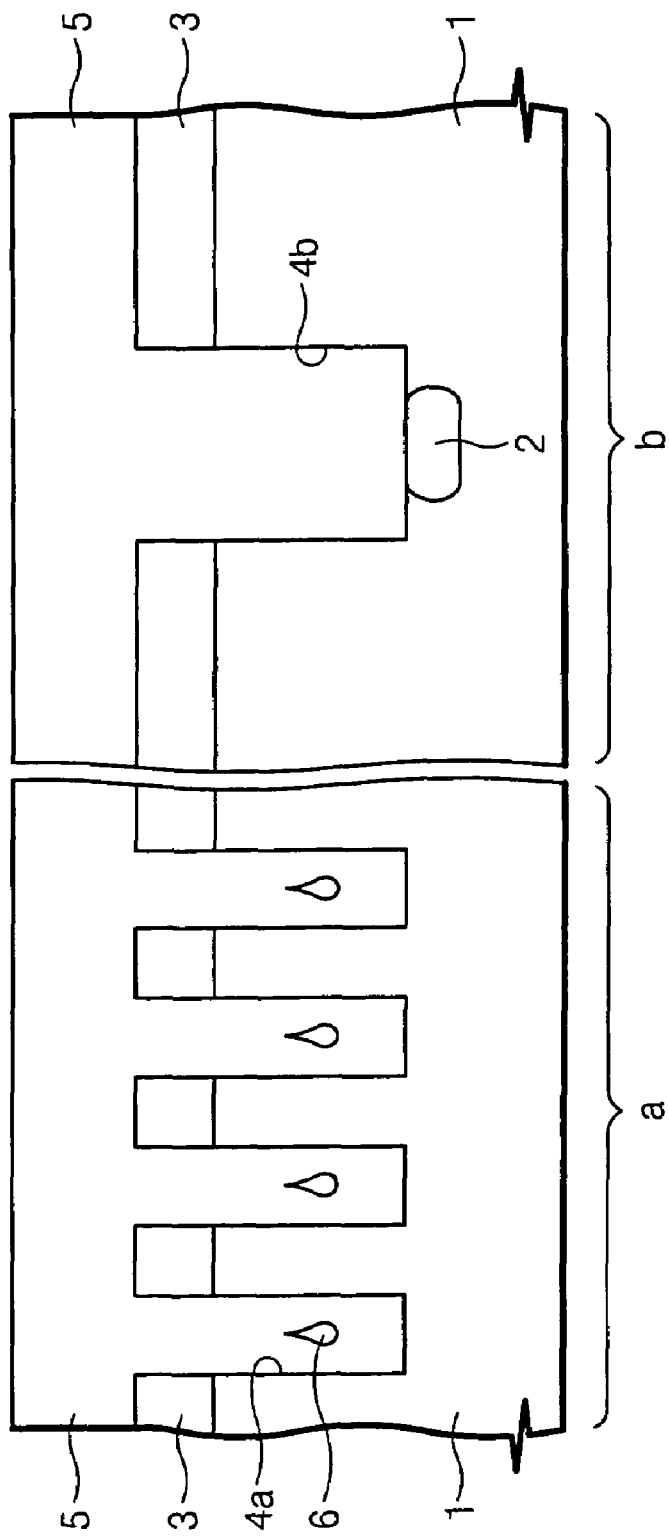
FIGS. 1 and 2 illustrate cross-sectional views according to a conventional method of forming a flash memory device having field oxides.

The present invention will now be described more fully hereinafter with reference to the accompanying drawings, in which preferred embodiments of the invention are shown. This invention may, however, be embodied in many different forms and should not be construed as limited to the embodiments set forth herein. The embodiments described herein are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present.

Furthermore, relative terms, such as "beneath", may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as "below" other elements would then be oriented "above" the other elements. The exemplary term "below", can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. Like numbers refer to like elements throughout.

Throughout this disclosure, the term "assistant trench" is synonymous with the term "pilot trench". In the context of this Specification, the word assistant and the word pilot convey equivalent meanings. In either case, the assistant, or pilot, trench is used as a precursor to the final trenches, as will become clear by reading through this Specification.

First Embodiment.

Figure 3:
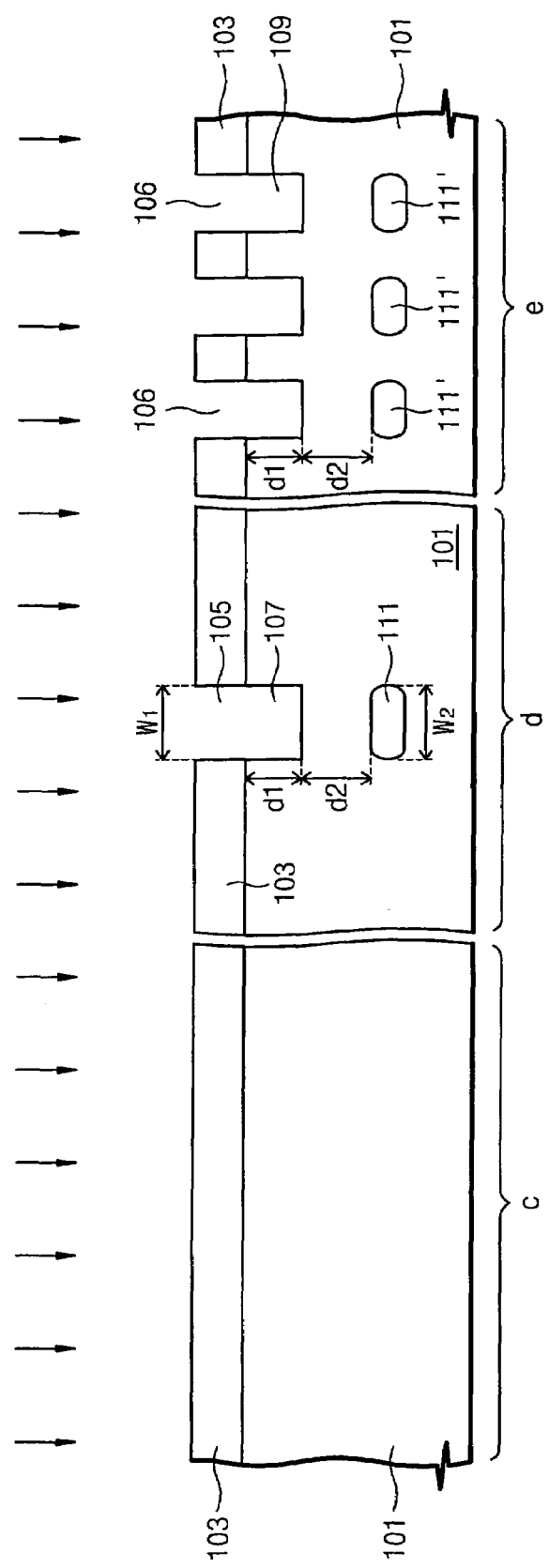
FIGS. 3 through 5 illustrate cross-sectional views of semiconductor devices for showing a method of forming field oxides according to an embodiment of the present invention.
Figure 4:
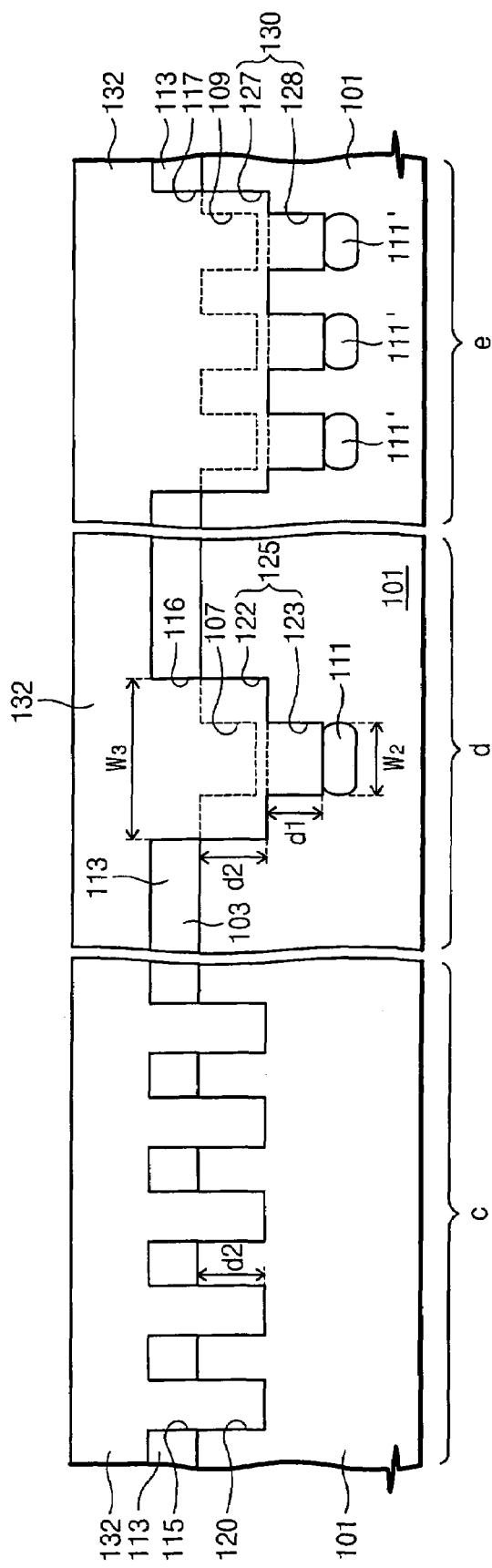
Figure 5:
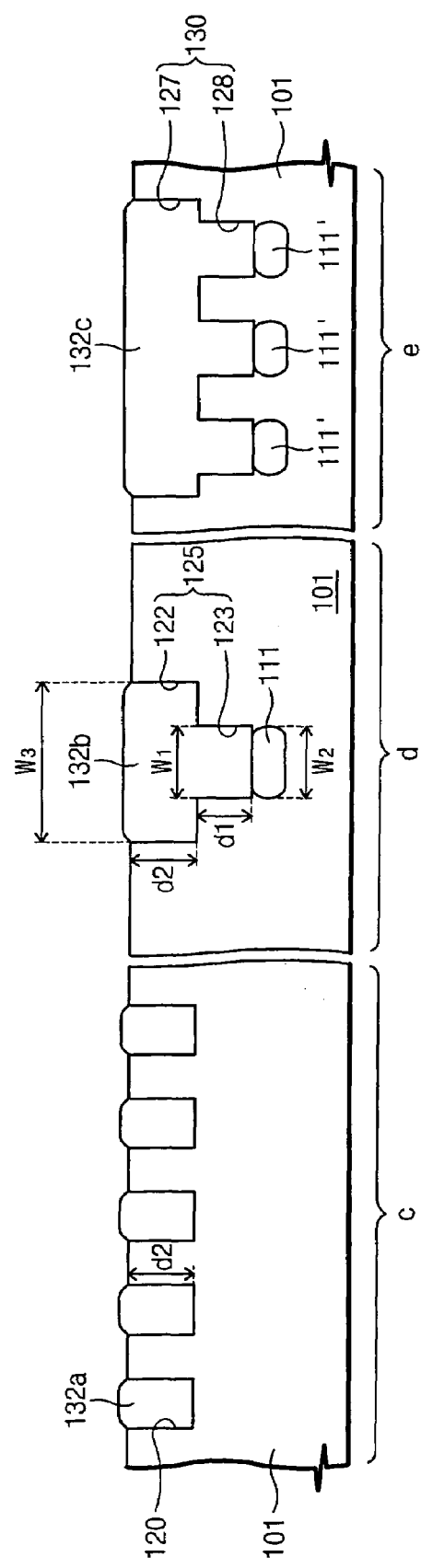

FIGS. 3 through 5 illustrate cross-sectional views of semiconductor devices for showing a method of forming field oxides according to a first embodiment of the present invention. In the FIGS. 3 through 5, reference letters c, d and e indicate a cell region, a high-voltage region and a key region, respectively.

Referring to FIG. 3, an assistant trench mask layer 103 is formed on the surface of a semiconductor substrate 101 having the cell region c, the high-voltage region d and key region e. The assistant trench mask layer 103 may be formed by a photoresist layer. An align key is formed for aligning a photomask in a subsequent photolithography process at the key region e. The key region e may be located in a scribe line.

The assistant trench mask layer 103 is patterned to form an assistant trench opening 105 exposing a predetermined region of a semiconductor substrate 101 at the high-voltage region d and exposing an initial key opening 106 exposing a predetermined region of a semiconductor substrate 101 at the key region e. The assistant trench opening 105 may have a width W1.

The semiconductor substrate 101 exposed by the assistant trench opening 105 and the initial key opening 106 is selectively etched to form an assistant trench 107 in the high-voltage region d and an initial key trench 109 in the key region e. The assistant trench 107 and the initial key trench 109 may have a depth d1.

Impurity ions are implanted by using the patterned assistant trench mask layer 103 as an ion-implantation mask to form a channel stop impurity-doped region 111. The channel stop impurity-doped region 111 is formed into the semiconductor substrate 101 spaced from the bottom of the assistant trench 107 with a depth d2. The channel stop impurity-doped region 111 is preferably formed to have a high concentration and an identical conductive type with the semiconductor substrate 101 around the channel stop impurity-doped region 111. For example, if the semiconductor substrate 101 around the channel stop impurity-doped region 111 is doped by P-type impurities, the channel stop impurity-doped region 111 is also doped by P-type impurities but with a higher concentration than the semiconductor substrate 101.

A width W2 of the channel stop impurity-doped region 111 is preferably identical with the width W1 of the assistant trench opening 105. That is, the width W1 of the assistant trench opening 105 is preferably determined by the width W2 of the channel stop impurity-doped region 111. When the channel stop impurity-doped region 111 is formed, an impurity-doped region 111' may be formed into the semiconductor substrate 101 under the initial key trench 109.

Referring to FIG. 4, the assistant trench mask layer 103 is removed from the semiconductor substrate 101 having the channel stop impurity-doped region 111.

A trench mask layer 113 is formed on a surface of the semiconductor substrate 101. The trench mask layer 113 may be formed of a hard mask layer. The hard mask layer may be formed of a buffer insulator and a silicon nitride that are sequentially stacked. Alternatively, the trench mask layer 113 may be formed of a photoresist layer.

The trench mask layer 113 is patterned to form a cell opening 115 exposing a predetermined region of the semiconductor substrate 101 at the cell region c, a high-voltage opening 116 exposing a predetermined region of the semiconductor substrate 101 at the high-voltage region d and a key opening 117 exposing a predetermined region of the semiconductor substrate 101 at the key region e.

The high-voltage opening 116 exposes at least the assistant trench 107. Preferably, the high-voltage opening 116 further exposes a predetermined surface of the semiconductor substrate 101 at both sides of the assistant trench 107. That is, the high-voltage opening 116 has a wider width W3 than the width W1 of the assistant trench 107, preferably. The key opening 117 preferably exposes the initial key trenches 109. The high-voltage opening 116 may be aligned with the assistant trench 107 by aligning the key opening 117 to the initial key trenches 109.

A bottom of the assistant trench 107 and the semiconductor substrate 101 exposed by the cell opening 115, the high-voltage opening 116 and the key opening 117 are anisotropically etched to form a cell trench 120 defining a cell active region, a high-voltage trench 125 defining a high-voltage active region, and a key trench 130.

Figure 2:
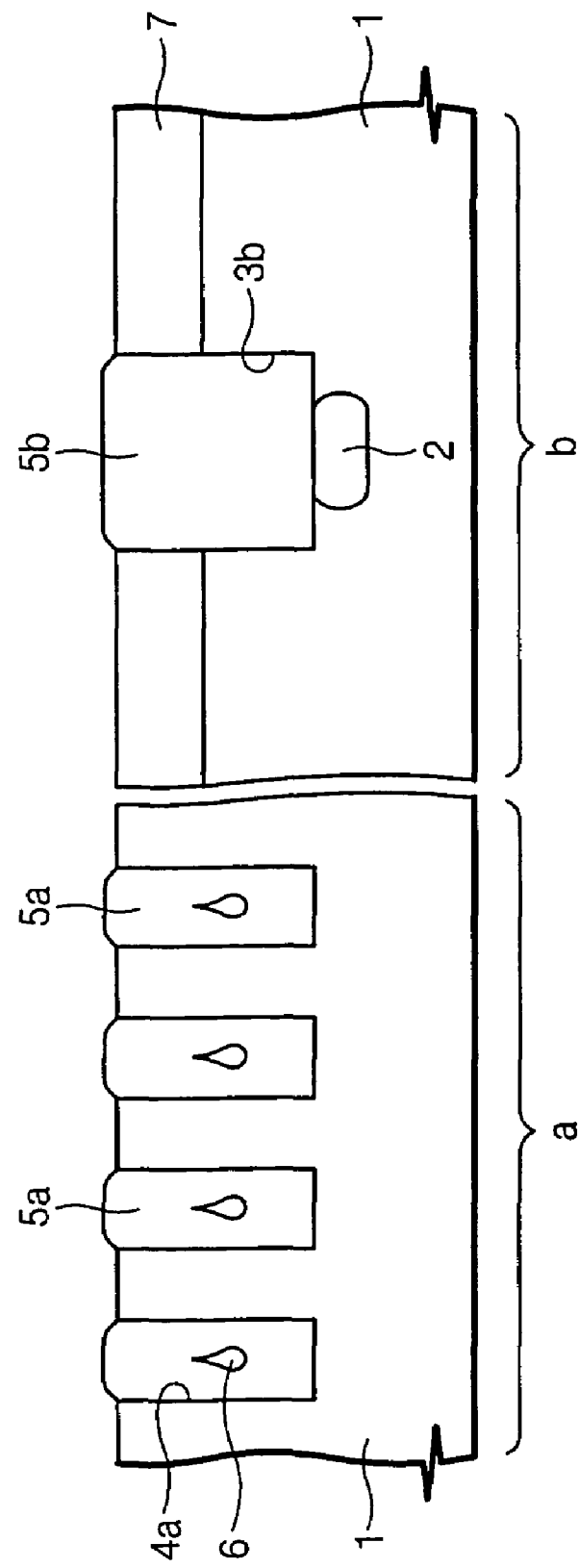

The cell trench 120 has a shallower depth than the conventional cell trench 4a illustrated in FIG. 2. Since the cell trench 120 has the shallower depth d2, the aspect ratio of the cell trench 120 is decreased compared with a conventional one.

The high-voltage trench 125 is composed of an upper trench 122 at the surface of the semiconductor substrate 101 and a bottom trench 123 at the bottom of the upper trench 122. The upper trench 122 has substantially the same width as the width W3 of the high-voltage opening 16. The upper trench 122 has substantially the same depth as the cell trench 120. The bottom trench 123 has substantially the same width as the width W1 of the assistant trench 107. The bottom trench 123 under the upper trench 122 has substantially the same depth as the depth d1 of the assistant trench 107. That is, the depth of the high-voltage trench 125 is determined by the sum of the depth d2 of the cell trench 120 and the depth d1 of the assistant trench 107. The bottom surface of the high-voltage trench 125, i.e., the bottom surface of the bottom trench 123, is preferably in contact with the channel stop impurity-doped region 111. Although the stop surface of the channel stop impurity-doped region 111 is in contact with the bottom surface of the bottom trench 123 in the figures, the channel stop impurity-doped region 111 is partially etched while forming the high-voltage trench 125. This is for maintaining a process margin in the etch process.

The key trench 130 is composed of an upper trench 127 at the surface of the semiconductor substrate 101 and bottom key trenches 128 at the bottom of the upper key trench 127. The upper key trench 127 has substantially the same depth as the depth d2 of the cell trench 120, and the bottom key trench 128 under the upper key trench 127 has substantially the same depth as the initial key trench 109.

Then, although not shown, a sidewall oxide (not illustrated) may be formed on inner sidewalls and bottoms of the trenches 120, 125 and 130. The sidewall oxide is for curing the inner sidewalls and the bottoms damaged in the etch process for forming the trenches 120, 125 and 130. The sidewall oxide may be formed of a thermal oxide.

A field insulator 132 is formed on a surface of the semiconductor substrate 101 to fill the cell trench 120, the high-voltage trench 125 and the key trench 130. The field insulator 132 may be formed of silicon oxide.

When the field insulator 132 is formed, since the cell trench 120 has the lower aspect ratio than the conventional cell trench, it is possible to prevent voids in the cell trench 120. Consequently, it is possible to improve reliability problems of a semiconductor device due to the voids.

Referring to FIG. 5, the field insulator 132 is planarized until the trench mask layer 113 is exposed, thereby forming a cell field oxide 132a in the cell trench 120, a high-voltage field oxide 132b in the high-voltage trench 125, and a key field oxide 132c in the key trench 130. The exposed trench mask layer 113 is removed by etching.

In the present embodiment, there is a difference between depths of the cell field oxide 132a and the high-voltage field oxide 132b. That is, the depth of the high-voltage field oxide 132b is a sum of the depth d2 of the cell field oxide 132a and the depth d1 of the bottom trench 123. Thus, it is possible to minimize a deterioration of punch through characteristic between the source/drain regions (not illustrated) of the high-voltage transistors formed on active regions at both sides of the high-voltage field oxide 132b. Also, it is possible to minimized the phenomenon that threshold voltage of a transistor is increased as a conventional channel stop impurity-doped layer is close to a semiconductor substrate.

Consequently, when the initial key trench 109 is formed, the assistant trench 107 is formed at the high-voltage region d. Therefore, it is possible to form the cell trench 120 having the shallower depth d2 and simultaneously to form the high-voltage trench 125 composed of the upper trench 122 and the bottom trench 123. Thus, voids occurring in conventional field oxides may be prevented and reliability problems of conventional high-voltage transistors may be improved.

In a case of a flash memory device, a high voltage is applied in the cell region c. However, since the high voltage is applied on a gate electrode of a unit cell (not illustrated), although the cell trench 120 has a shallower depth, punch through between unit cells doesn't occur.

Second Embodiment.

This second embodiment is similar to the previously described first embodiment of the present invention. However, in this second embodiment, a bottom trench has a wider width than a channel stop impurity-doped region, but narrower than an upper trench.

FIGS. 6 through 9 illustrate cross-sectional views of semiconductor devices for showing a method of forming field oxides according to another embodiment of the present invention.

Figure 6:
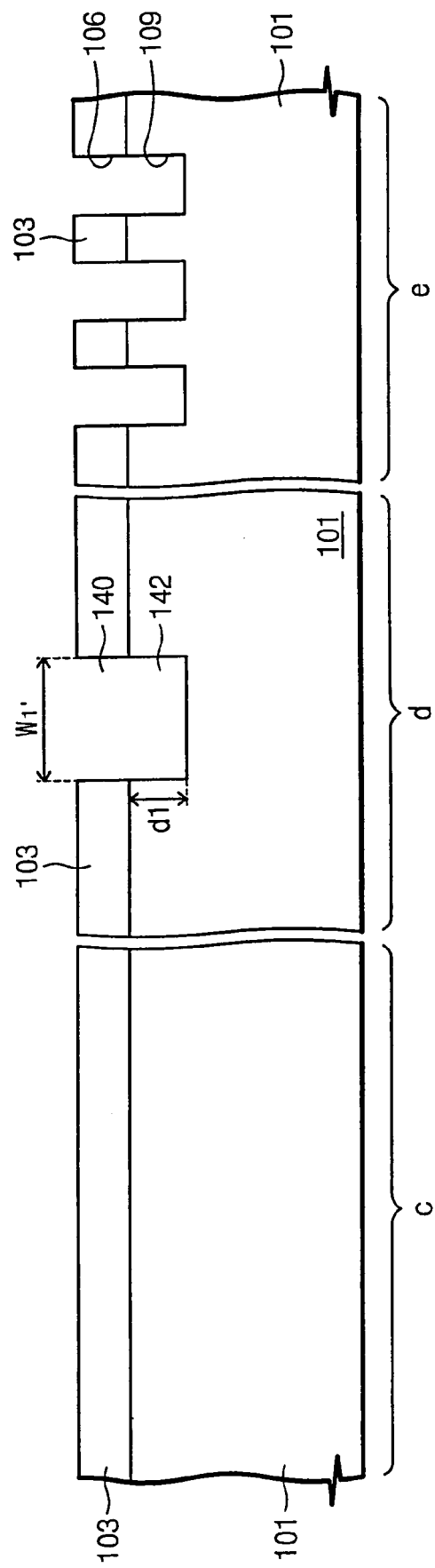
FIGS. 6 through 9 illustrate cross-sectional views of semiconductor devices for showing a method of forming field oxides according to another embodiment of the present invention.

Referring to FIG. 6, an assistant trench mask layer 103 is formed on a surface of a semiconductor substrate 101 having a cell region c, a high-voltage region d and a key region e.

The assistant trench mask layer 103 is patterned to form an assistant trench opening 140 exposing a predetermined region of the semiconductor substrate 101 at the high-voltage region d, and to form an initial key opening 106 exposing a predetermined region of the semiconductor substrate 101 at the key region e. The assistant trench opening 140 has a predetermined width W1'. At this time, the width W1' of the assistant trench opening 140 is wider than one of the first embodiment.

The semiconductor substrate 101 exposed by the assistant trench opening 140 and the initial key opening 106 is selectively etched to form an assistant trench 142 at the high-voltage region b and an initial key trench 109 in the key region d.

The assistant trench 142 has substantially the same width as the width W1' of the assistant trench opening 140. The assistant trench 142 has a predetermined depth d1 identical with the initial key trench 19.

Figure 7:
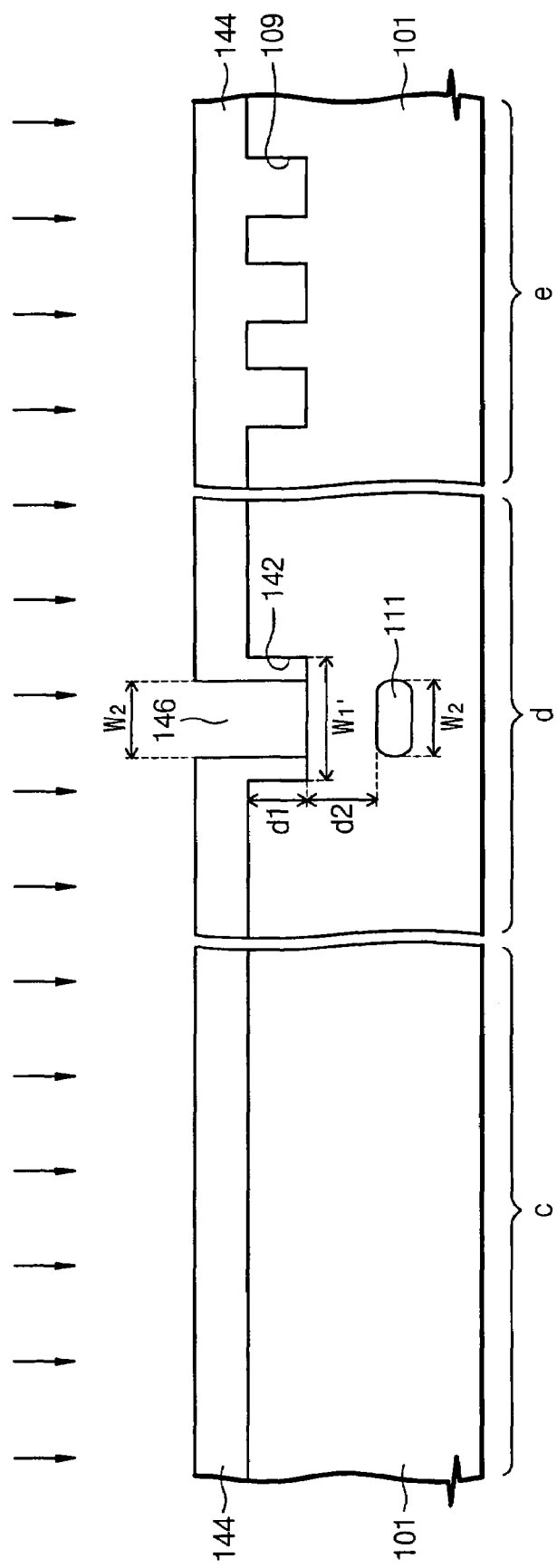

Referring to FIG. 7, the assistant trench mask layer 103 is removed from the semiconductor substrate 101 having the assistant trench 142.

Then, an ion-implantation mask layer 144 is formed on the semiconductor substrate 101 and patterned to form an ion-implantation opening 146 exposing a predetermined region of the bottom surface of the assistant trench 142. At this time, the cell region c and the key region d may be covered by the ion-implantation mask layer 144. On the contrary, an opening (not illustrated) may be formed for forming a channel impurity-doped region (not illustrated) at a surface of the semiconductor substrate 101 at the cell region c. An align key of the patterned ion-implantation mask 144 may be aligned by another align key (not illustrated).

The width W2 of the ion-implantation opening 146 is preferably narrower than the width W1' of the assistant trench 142. The ion-implantation mask layer 144 may be formed of a photoresist layer.

Impurity ions are implanted by using the patterned ion-implantation mask layer 144 as a mask, thereby forming a channel stop impurity-doped region 111 apart from the bottom surface of the assistant trench 142 with a depth d2. At this time, the channel stop impurity-doped region 111 preferably has substantially the same width as the width W2 of the ion-implantation opening 146.

Figure 8:
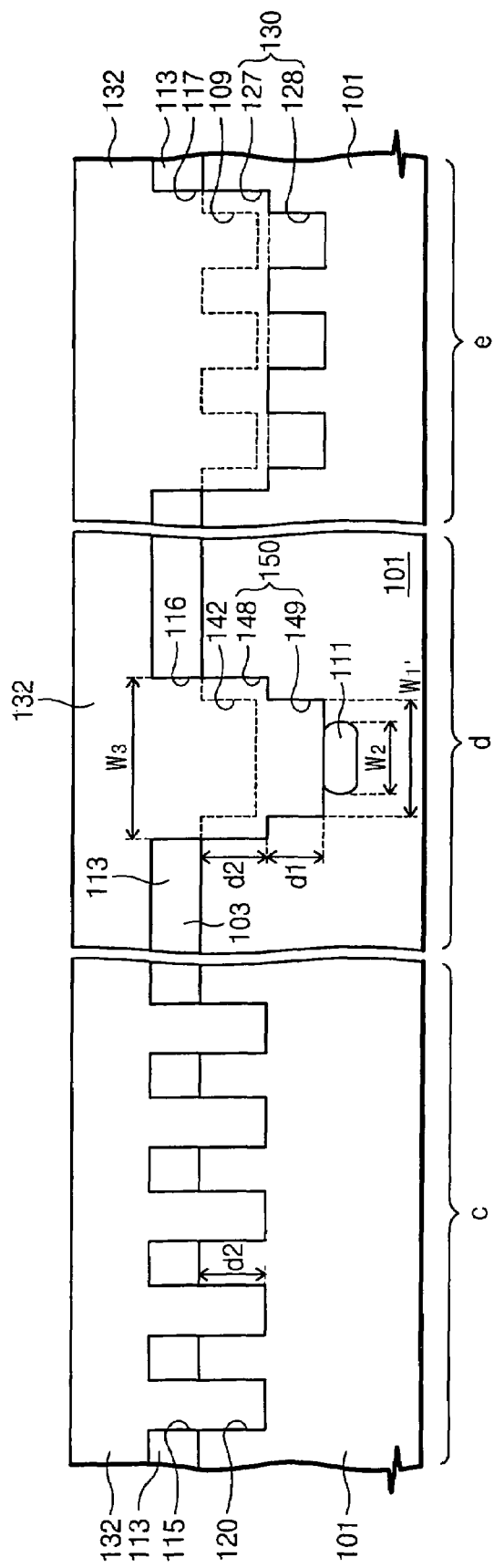
Figure 9:
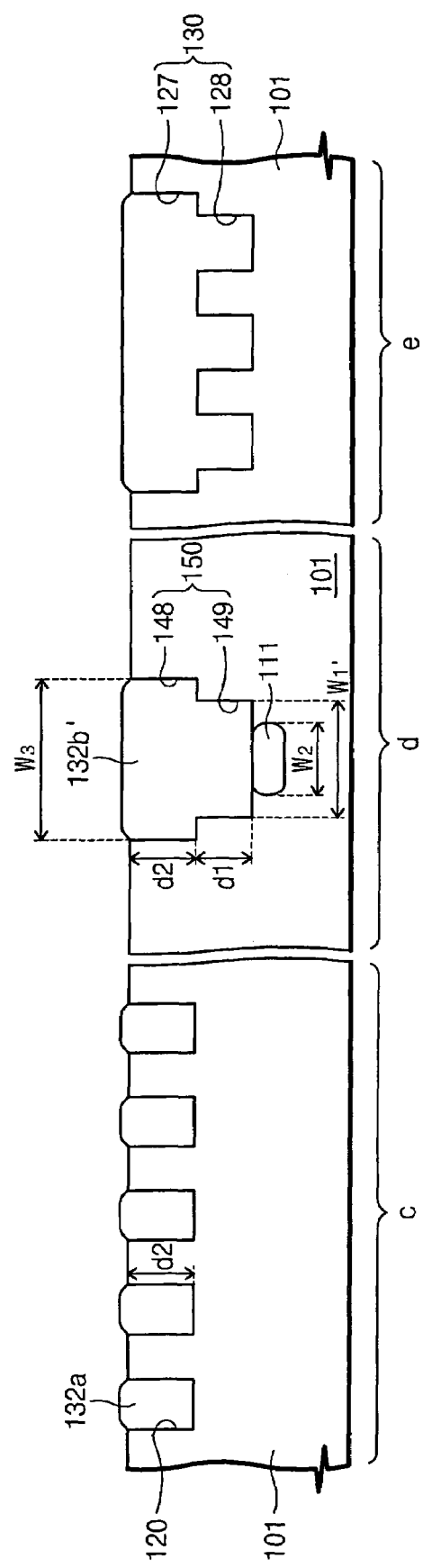

Referring to FIGS. 8 and 9, the patterned ion-implantation mask layer 144 is removed from the semiconductor substrate 101 having the channel stop impurity-doped region 111. Then, a trench mask layer 113 is formed on a surface of the semiconductor substrate 101.

The trench mask layer 113 is patterned to form a cell opening 115 exposing a predetermined region of the semiconductor substrate 101 at the cell region c, to form a high-voltage opening 116 exposing a predetermined region of the semiconductor substrate 101 at the high-voltage region d and to form a key opening 117 exposing a predetermined region of the semiconductor substrate 101 at the key region e. At this time, the width W3 of the high-voltage opening 116 is preferably wider than the width W1' of the assistant trench 142. That is, the width W1' of the assistant trench 142 is wider than the width W2 of the channel stop impurity-doped region 111, but narrower than the width W3 of the high-voltage opening 116.

The exposed semiconductor substrate 101 is anisotropically etched to form a cell trench 120 defining a cell active region at the cell region c, a high-voltage trench 150 defining a high-voltage active region at the high-voltage region d, and a key trench 130 at the key region e.

The cell trench 120 preferably has a shallower depth than a conventional cell trench. The high-voltage trench 150 is composed of an upper trench 148 formed at the surface of the semiconductor substrate 101 and a bottom trench 149 formed at the bottom surface of the upper trench 148. The upper trench 148 has substantially the same depth as the depth d2 of the cell trench 120. The bottom trench 149 under the upper trench 148 has the identical depth with the depth d1 of the assistant trench 142. The bottom trench 149 is preferably in contact with the channel stop impurity-doped region 111. The key trench 130 is composed of an upper key trench 127 and a bottom key trench 128 like the first embodiment.

A field insulator 132 is formed on a surface of the semiconductor substrate 101 to fill the trenches 120, 150 and 130. The field insulator 132 is planarized until the trench mask layer 113 is exposed, thereby forming a cell field oxide 132a in the cell trench 120, a high-voltage field oxide 132b' in the high-voltage trench 150, and a key field oxide 132c in the key trench 130. The exposed trench mask layer 113 is removed.

The trench mask layer 113 and the field insulator 132 may be formed of the identical layers explained in the first embodiment.

Consequently, the cell trench 120 has the shallower depth d2 than a conventional one, thereby preventing voids. Also, with the upper and bottom trenches 148 and 149, the high-voltage trench 150 has the deeper depth than the depth d2 of the cell trench 120. Thus, reliability problems of the conventional high-voltage transistor may be improved.

Furthermore, in the present embodiment, the width W1' of the assistant trench 142 determining the width of the bottom trench 149 is wider than the width W2 of the channel stop impurity-doped region 111 and narrower than the width W3 of the upper trench 148. As a result, it is possible to maintain a process margin with respect to the width W1' of the assistant trench 142.

Third Embodiment.

In this third embodiment of the invention, an assistant trench for a high-voltage trench is not formed. That is, an upper trench and a bottom trench of the high-voltage trench are sequentially formed.

FIGS. 10 through 13 illustrate cross-sectional views of semiconductor devices for showing a method of forming field oxides according to still another embodiment of the present invention.

Figure 10:
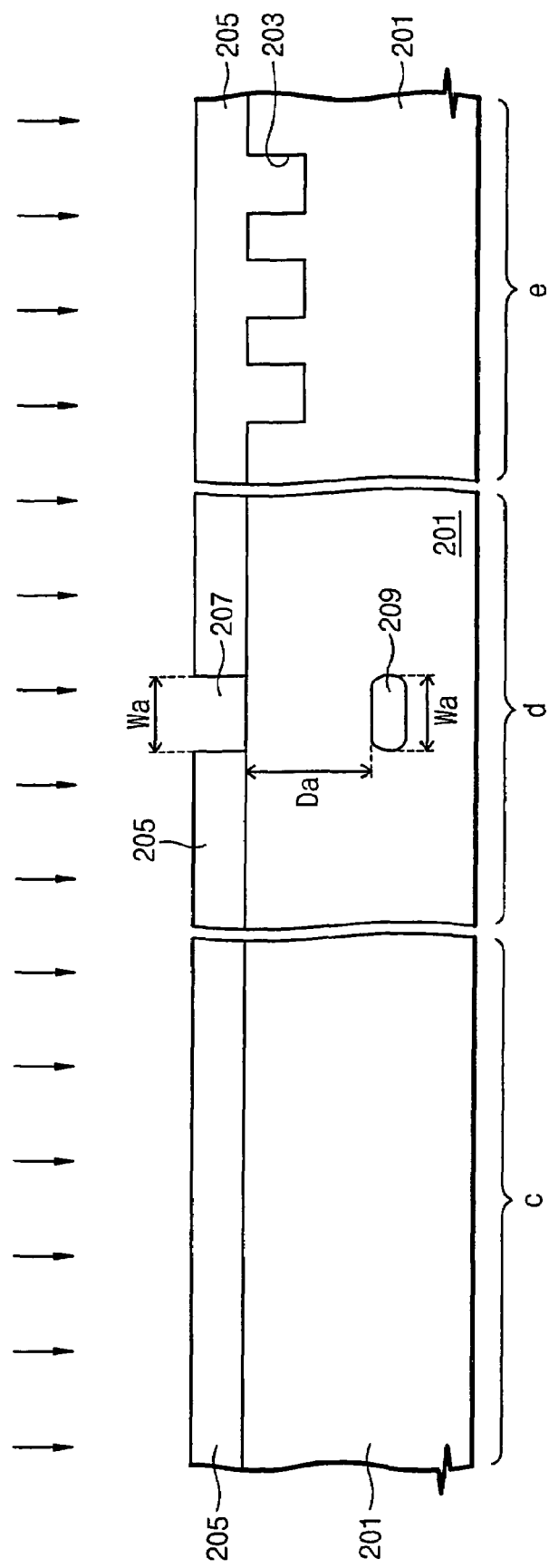
FIGS. 10 through 13 illustrate cross-sectional views of semiconductor devices for showing a method of forming field oxides according to still another embodiment of the present invention.

Referring to FIG. 10, a semiconductor substrate 201 having a cell region c, a high-voltage d and a key region e are selectively etched to form an initial key trench 203 in the key region e.

An ion-implantation mask layer 205 is formed on a surface of the semiconductor substrate 201 having the initial key trench 203. The ion-implantation mask layer 205 is patterned to form an ion-implantation opening 207 exposing a predetermined region of the semiconductor substrate 101 at the high-voltage region d. At this time, another opening (not illustrated) may be formed at the cell region c in order to implant impurity ions for controlling a threshold voltage of a cell transistor (not illustrated). The ion-implantation mask layer 205 may be formed of a photoresist layer. The mask pattern may be aligned by another align key when the ion-implantation opening 207 is formed.

Impurity ions are implanted by using the patterned ion-implantation mask layer 205 as a mask, thereby forming a channel stop impurity-doped region 209 in the semiconductor substrate 201 apart from the surface of the exposed semiconductor substrate 201 with a predetermined depth Da. Then, although not illustrated, other impurity ions are implanted into the exposed semiconductor substrate 101 at the cell region c, thereby forming a surface impurity-doped layer (not illustrated).

Figure 11:
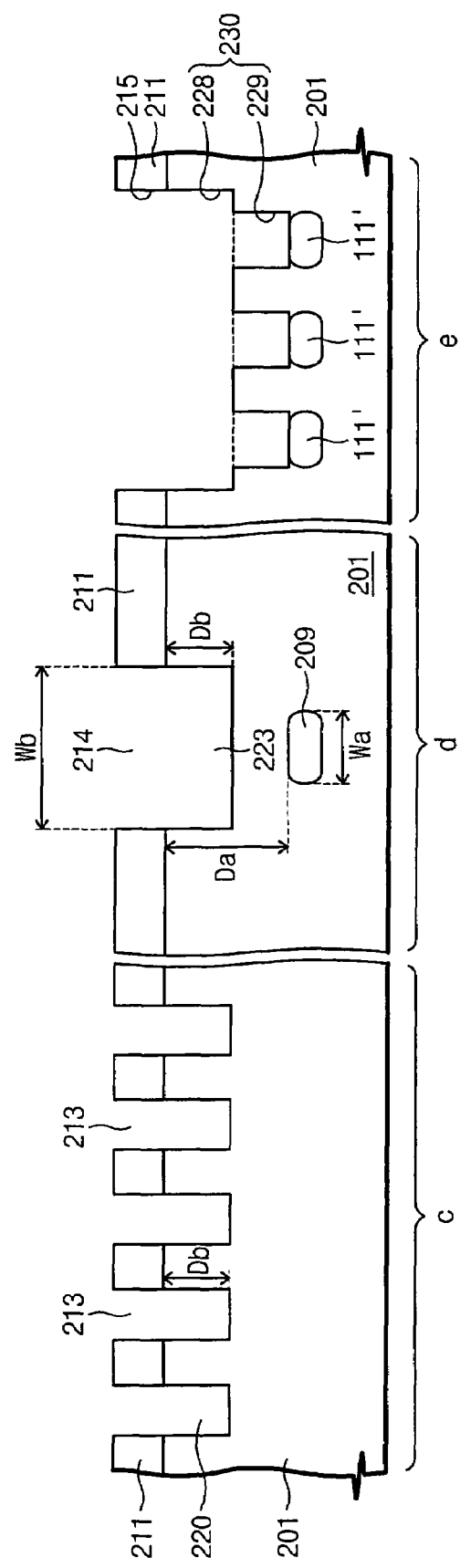

Referring to FIG. 11, the patterned ion-implantation mask 205 is removed from the semiconductor substrate 201 having the channel stop impurity-doped region 209. Then, a first trench mask layer 211 is formed on the semiconductor substrate 201. The first trench mask layer 211 may be formed by a hard mask layer or a photoresist layer. The hard mask layer may be formed of sequentially stacked buffer oxide and silicon nitride.

The first trench mask layer 211 is patterned to form a cell opening 213 exposing a predetermined region of the semiconductor substrate 201 located at the cell region c, an upper trench opening 214 exposing a predetermined region of the semiconductor substrate 201 at the high-voltage region d, and a key opening 215 exposing a predetermined region of the semiconductor substrate 201 at the key region 2. The upper trench opening 214 has a predetermined width Wb. The key opening 215 may preferably expose the initial key trenches 203.

The exposed semiconductor substrate 201 is selectively etched to from a cell trench 220 defining a cell active region at the cell region c, an upper trench 223 defining a high-voltage active region at the high-voltage region d and a key trench 230 in the key region e. The cell trench 220 has a shallower depth Db than a conventional one. The upper trench 223 has the identical width as the width Wb of the upper trench opening 214. The upper trench 223 has substantially the same depth as the depth Db of the cell trench 220. The key trench 230 is composed of an upper key trench 228 formed at the surface of the semiconductor substrate 230 and a bottom key trench 229 formed at the bottom surface of the upper key trench 228.

Figure 12:
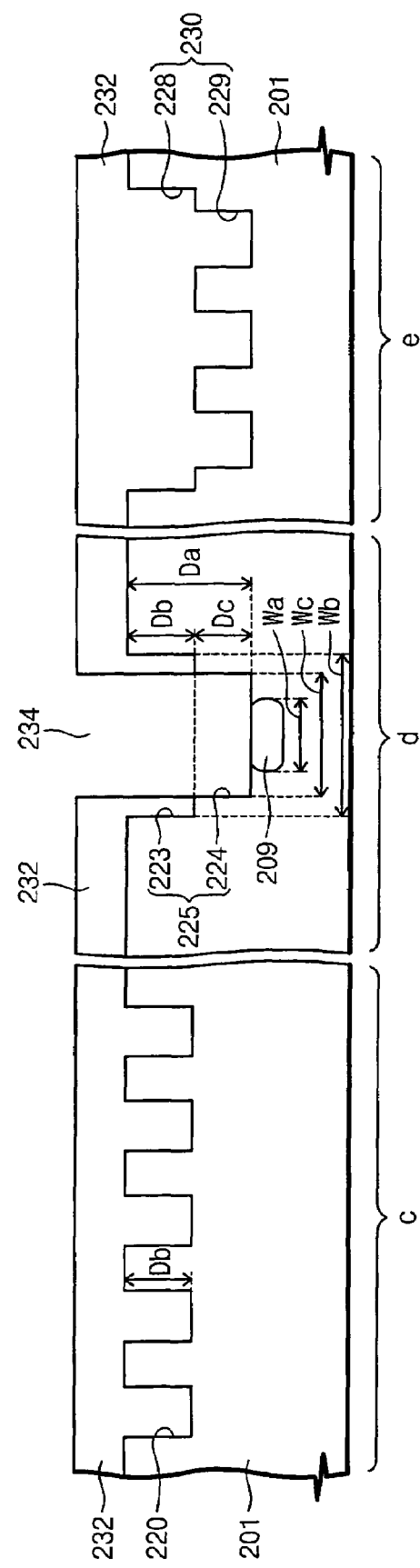

Referring to FIG. 12, the first trench mask layer 211 is removed by etching from the semiconductor substrate 201 having the upper trench 223, and a second trench mask layer 232 is formed on a surface of the semiconductor substrate 201. The second trench mask layer 232 may be formed by a photoresist layer.

The second trench mask layer 232 is patterned to form a bottom trench opening 234 exposing a predetermined region of the bottom surface of the upper trench 223. At this time, the cell region c may be covered by the second trench mask layer 232. The key region e may be aligned by exposing another align key (not illustrated).

The bottom surface of the exposed upper trench 223 is selectively etched to form a bottom trench 224. The bottom surface of the bottom trench 224 is preferably in contact with the channel stop impurity-doped region 209. A width Wc of the bottom trench 224 is preferably narrower than the width Wa of the upper trench 223. Furthermore, the width Wc of the bottom trench 224 is equal to or wider than the width Wa of the channel stop impurity-doped region 209. The upper and bottom trenches 223 and 224 compose the high-voltage trench 225. As a result, the depth of the high-voltage trench 225 is a sum of the depth Db of the cell trench and the depth Dc of the bottom trench under the upper trench 223.

The channel stop impurity-doped region 209 may be formed after forming the upper trench 223. On the contrary, the channel stop impurity-doped region 209 may be formed after forming the bottom trench 224.

Figure 13:
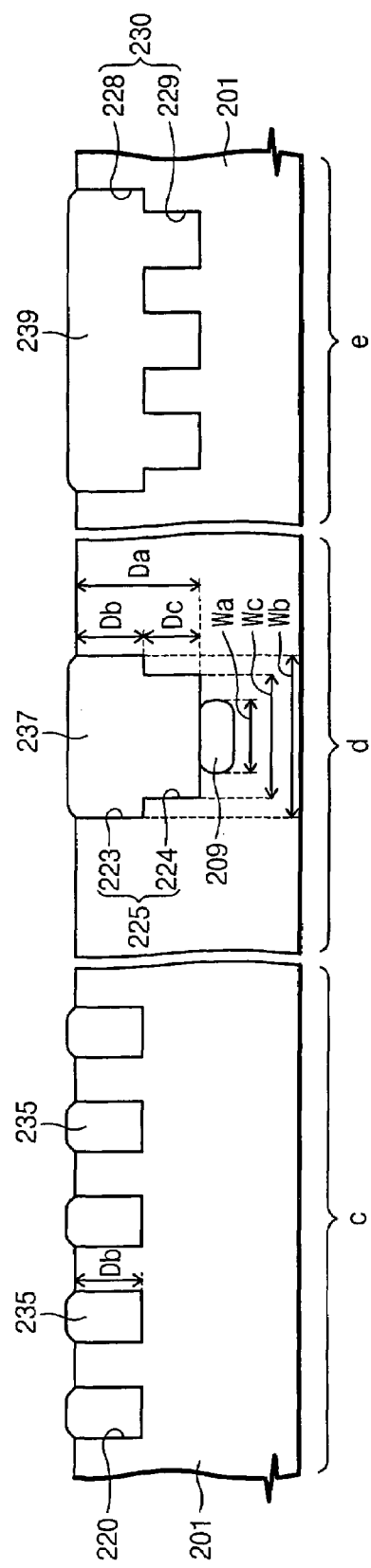

Referring to FIG. 13, the second trench mask layer 232 is removed from the semiconductor substrate 202 having the high-voltage trench 225, thereby exposing the cell trench 220, the high-voltage trench 225 and the key trench 230. Then, a field insulator (not illustrated) is formed on a surface of the semiconductor substrate 201 to fill the exposed cell trench 220, the high-voltage trench 225 and the key trench 230. The field insulator is planarized until the semiconductor substrate 201 is exposed, thereby forming a cell field oxide 235 filling the cell trench 220, a high-voltage field oxide 237 filling the high-voltage trench 225 and a key field oxide filling the key trench 230.

Consequently, the cell trench 220 has a shallower depth than a conventional one, it is possible to prevent voids. Simultaneously, since the depth of the high-voltage trench 225 is the sum of the depth Db of the cell trench 220 and the depth Dc of the bottom trench 224, it is possible to improve reliability problems of a conventional high-voltage transistor.

As described above, according to the present invention, a cell trench is shallowly formed in comparison with a conventional one, and simultaneously, a high-voltage trench composed of an upper trench having substantially the same depth as the cell trench and a bottom trench formed at the bottom surface of the upper trench is formed. Consequently, an aspect ratio of the cell trench is decreased, thereby preventing voids. Also, the high-voltage trench has a deeper depth than the cell trench, thereby improving reliability problems of high-voltage transistors.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A method of forming semiconductor devices having field isolation layers in trenches, comprising:
   providing a semiconductor substrate that includes a cell region and a high voltage region;
   forming a pilot trench at a location in the high voltage region;
   concurrently forming an upper trench, a bottom trench in the high voltage region, and a trench in the cell region, the upper trench substantially centered at the location of the pilot trench, the bottom trench having a top at substantially the same level as a bottom surface of the upper trench, and the upper trench having a wider width than that of the bottom trench; and
   forming a field isolation layer filling the bottom trench and the upper trench.

2. The method as claimed in claim 1, wherein concurrently forming the upper trench and bottom trench comprises:
   forming a trench mask layer on the semiconductor substrate having the pilot trench;
   forming an opening exposing the pilot trench and a predetermined region of the semiconductor substrate at both sides of the pilot trench by patterning the trench mask layer; and
   forming the upper trench arid the bottom trench by anisotropically etching the exposed bottom surface of the pilot trench and the semiconductor substrate,
   wherein the upper trench has substantially the same width as the opening and the bottom trench has substantially the same width as the pilot trench.

3. The method as claimed in claim 2, further comprising forming a channel stop impurity-doped region in the semiconductor substrate apart from the bottom surface of the pilot trench with a predetermined depth, wherein the bottom surface of the bottom trench is in contact with the channel stop impurity-doped region.

4. The method as claimed in claim 3, wherein the pilot trench has substantially the same width as the channel stop impurity-doped region.

5. The method as claimed in claim 4, wherein forming the pilot trench and the channel stop impurity-doped region comprises:
   forming a pilot trench mask layer on the semiconductor substrate;
   forming a pilot trench opening exposing a predetermined region of the semiconductor substrate by patterning the pilot trench mask;
   forming the pilot trench by selectively etching the exposed semiconductor substrate;
   forming a channel stop impurity-doped region in the semiconductor substrate apart from the bottom surface of the pilot trench with a predetermined depth by implanting impurity ions using the patterned pilot trench mask layer as a mask; and
   removing the patterned pilot trench mask layer.

6. The method as claimed in claim 3, wherein the pilot trench has a wider width than the channel stop impurity-doped region.

7. The method as claimed in claim 6, wherein forming the channel stop impurity-doped region comprises:
   forming an ion-implantation mask layer on the semiconductor substrate having the pilot trench;
   forming an ion-implantation opening having a narrower width than that of the pilot trench and exposing a bottom predetermined region of the pilot trench by patterning the ion-implantation mask layer;
   forming a channel stop impurity-doped region in the semiconductor substrate apart from the bottom surface of the pilot trench by implanting impurity ions using the patterned ion-implantation mask as a mask; and
   removing the patterned ion-implantation mask.

8. The method as claimed in claim 2, wherein forming the field isolation layer comprises:
   forming a field insulator filling the upper trench and the bottom trench on a surface of the semiconductor substrate;
   planarizing the field insulator until the patterned trench mask layer is exposed; and
   removing the exposed trench mask layer.

9. The method as claimed in claim 1, wherein concurrently forming the upper trench and the bottom trench comprises:
   forming the upper trench at a predetermined region of the semiconductor substrate; and
   concurrently forming the bottom trench by selectively etching a predetermined bottom region of the pilot trench.

10. The method as claimed in claim 9, further comprising forming a channel stop impurity-doped region in the semiconductor substrate under the bottom trench, wherein the bottom surface of the bottom trench is in contact with the channel stop impurity-doped region.

11. The method as claimed in claim 9, wherein the pilot trench has an identical or wider width than that of the channel stop impurity-doped region.

12. A method of forming semiconductor devices having field isolation layers in trenches comprising:
    providing a semiconductor substrate having a first region and a second region;
    forming a pilot trench in the second region;
    forming in a single step, a first trench in the first region and enlarging the pilot trench to form a second trench composed of an upper trench and a bottom trench at the bottom of the upper trench; and
    forming a first field isolation layer filling the first trench and a second field isolation layer filling the second trench,
    wherein the first trench and the upper trench have identical depths from a surface of the semiconductor substrate and the upper trench has a wider width than that of the bottom trench.

13. The method as claimed in claim 12, wherein forming the first trench and the second trench comprises:
    forming a trench mask layer on the semiconductor substrate having the pilot trench;
    patterning the trench mask layer to form a first opening exposing a predetermined region of the semiconductor substrate at the first region and a second opening exposing the pilot trench and a predetermined region of the semiconductor substrate at both sides of the pilot trench at the second region; and
    anisotropically etching the semiconductor substrate and a bottom surface of the pilot trench exposed by the first opening and the second opening to form the first trench and the second trench,
    wherein the upper trench has substantially the same width as the second opening and the bottom trench has substantially the same width as the pilot trench.

14. The method as claimed in claim 12, wherein after forming the pilot trench, the method further comprising forming a channel stop impurity-doped region in the semiconductor substrate apart from a bottom surface of the pilot trench with a predetermined depth, wherein a bottom surface of the bottom trench is in contact with the channel stop impurity-doped region.

15. The method as claimed in claim 14, wherein the pilot trench has substantially the same width as the channel stop impurity-doped region.

16. The method as claimed in claim 15, wherein forming of the pilot trench and the channel stop impurity-doped region comprises:
    forming a pilot trench mask layer on the semiconductor substrate;
    forming a pilot trench opening exposing a predetermined region of the semiconductor substrate at the second region by patterning the pilot trench mask layer;
    forming the pilot trench by etching the exposed semiconductor substrate;
    forming a channel stop impurity-doped region in the semiconductor substrate apart from a bottom surface of the pilot trench with a predetermined region by implanting impurity ions using the patterned pilot mask layer as a mask; and
    removing the patterned pilot trench mask layer.

17. The method as claimed in claim 14, wherein the pilot trench has a wider width than that of the channel stop impurity-doped region.

18. The method as claimed in claim 17, wherein forming the channel stop impurity-doped region comprises:
    forming an ion-implantation mask layer on the semiconductor substrate having the pilot trench;
    forming an ion-implantation opening having a narrower width than that of the pilot trench and exposing a predetermined region of a bottom surface of the pilot trench by patterning the ion-implantation mask layer;
    forming a channel stop impurity-doped region in the semiconductor substrate apart from a bottom surface of the pilot trench with a predetermined depth by implanting impurity ions using the patterned ion-implantation mask layer as a mask; and
    removing the patterned ion-implantation mask layer.

19. The method as claimed in claim 12, wherein forming the first trench and the second trench comprises:
    forming the first trench at a predetermined region of the semiconductor substrate at the first region and the upper trench at a predetermined region of the semiconductor substrate at the second region; and
    forming the bottom trench by selectively etching a predetermined region of a bottom surface of the upper trench.

20. The method as claimed in claim 19, further comprising forming a channel stop impurity-doped region under a bottom surface of the bottom trench, wherein the bottom surface of the bottom trench is in contact with the channel stop impurity-doped region.

21. The method as claimed in claim 20, wherein a width of the bottom trench is equal to or wider than that of the channel stop impurity-doped region.

22. A method of forming semiconductor devices having field oxides layers in trenches comprising:
    providing a semiconductor substrate having a first region, a second region and a key region
    forming a pilot trench at a predetermined region of a semiconductor substrate at the second region and an initial key trench at a predetermined region of the semiconductor substrate at the key region;
    forming a trench mask layer on a surface of the semiconductor substrate having the pilot trench and the key trench;
    patterning the trench mask layer to form a first opening exposing a predetermined region of the semiconductor substrate at the first region, a second opening exposing the pilot trench and a predetermined region of the semiconductor substrate at both sides of the pilot trench the second region and a key opening exposing the initial key trench and a predetermined region of the semiconductor substrate at the key region;
    anisotropically etching the bottom surface of the pilot trench and the exposed semiconductor substrate to form a first trench at the first region, a second trench composed of an upper trench at a surface of the semiconductor substrate at the second region and a bottom trench at a bottom surface of the upper trench, and a key trench composed of an upper key trench at a surface of the semiconductor substrate at the key region and a bottom key trench at a bottom surface of the upper key trench; and
    forming a first field oxide layer in the first trench, a second field oxide layer in the second trench and a key field oxide layer in the key trench,
    wherein the first trench, the upper trench and the upper key trench have identical depths from a surface of the semiconductor substrate, the upper trench has substantially the same width as the second opening and the bottom trench has substantially the same width as the pilot trench.

* * * * *

UNITED STATES PATENT AND TRADEMARK OFFICE
CERTIFICATE OF CORRECTION

PATENT NO. : 6,979,628 B2 Page 1 of 1
APPLICATION NO. : 10/726788
DATED : December 27, 2005
INVENTOR(S) : Kim et al.

It is certified that error appears in the above-identified patent and that said Letters Patent is hereby corrected as shown below:

At column 1, line 35, please replace "nonvolatile" with --non-volatile--
At column 1, line 43, please replace "nonvolatile" with --non-volatile--
At column 11, line 29, please replace "trench arid" with --trench and--
At column 14, line 11, please replace "field oxides layers" with --field oxide layers--
At column 14, line 13, please replace "key region" with --key region;--

Signed and Sealed this

Sixteenth Day of January, 2007

JON W. DUDAS
*Director of the United States Patent and Trademark Office*